(12) United States Patent
Moon et al.

(10) Patent No.: US 7,215,456 B2
(45) Date of Patent: May 8, 2007

(54) METHOD FOR PATTERNING SELF-ASSEMBLED COLLOIDAL PHOTONIC CRYSTALS AND METHOD FOR FABRICATING 3-DIMENSIONAL PHOTONIC CRYSTAL WAVEGUIDES OF AN INVERTED-OPAL STRUCTURE USING THE PATTERNING METHOD

(75) Inventors: Il-kwon Moon, Suwon (KR); Jong-ho Kim, Seoul (KR); Sang-hoon Shin, Yongin-si (KR); Suk-han Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 97 days.

(21) Appl. No.: 11/056,101

(22) Filed: Feb. 14, 2005

(65) Prior Publication Data

US 2005/0185254 A1    Aug. 25, 2005

(30) Foreign Application Priority Data

Feb. 19, 2004    (KR) .................... 10-2004-0010977

(51) Int. Cl.
- G02F 1/03 (2006.01)
- G02B 26/00 (2006.01)
- C30B 7/00 (2006.01)
- C30B 23/00 (2006.01)
- B32B 3/00 (2006.01)

(52) U.S. Cl. .................... 359/245; 359/296; 117/68; 117/92; 428/173; 428/141; 428/612

(58) Field of Classification Search ................ 359/245, 359/296, 321; 430/52, 141, 318, 919, 923, 430/925; 423/348; 428/195.1, 553, 612, 428/141, 143, 156, 167, 173; 264/344; 345/105–108; 204/471, 483; 216/56; 252/583, 586; 522/87; 117/68, 69, 72, 79, 92, 103; 435/5; 250/303

See application file for complete search history.

(56) References Cited

U.S. PATENT DOCUMENTS 3,436,215 A * 4/1969 Levinos et al. ............... 430/52

(Continued)

FOREIGN PATENT DOCUMENTS

JP    2003-002687 A    1/2003

OTHER PUBLICATIONS

Hayward R C et al:., "Electrophoretic assembly of colloidal crystals with optically tunable micropatterns", Nature Macmillan Magazines UK, vol. 404, No. 6773, Mar. 2, 2000, pp. 56-59, XP002334780.

(Continued)

Primary Examiner—Loha Ben
(74) Attorney, Agent, or Firm—Sughrue Mion, PLLC (57) ABSTRACT

A method for patterning self-assembled colloidal photonic crystals and a method for fabricating three-dimensional photonic crystal waveguides having an inverted-opal structure using the patterning method. The patterning method includes depositing first and second conductive films separate from each other, on an area corresponding to a pattern of the self-assembled colloidal photonic crystals that are to be formed on a substrate and on another area except for the area corresponding to the pattern, respectively, and growing the photonic crystals on the substrate on which the first and second conductive films are deposited by dip-coating in a fluid containing colloidal particles while applying a DC voltage to the respective first and second conductive films. Various types of colloidal photonic crystals can be fabricated depending on the electrode pattern defined on the substrate. Additionally, three-dimensional photonic crystal waveguides of an inverted-opal structure having a photonic band gap in all light-traveling directions can be fabricated.

2 Claims, 9 Drawing Sheets

U.S. PATENT DOCUMENTS

| | | | | |
|---|---|---|---|---|
| 6,409,907 B1 * | 6/2002 | Braun et al. | ............... | 205/317 |
| 6,441,945 B1 * | 8/2002 | Atwater et al. | ............. | 359/296 |
| 6,517,763 B1 * | 2/2003 | Zakhidov et al. | ........... | 264/344 |
| 6,585,947 B1 * | 7/2003 | Nayfeh et al. | ............... | 423/348 |
| 6,821,714 B1 * | 11/2004 | Mescher et al. | ............ | 430/318 |
| 6,846,474 B2 * | 1/2005 | Nayfeh et al. | ............... | 423/348 |
| 6,846,578 B2 * | 1/2005 | Kumacheva et al. | ........ | 428/612 |
| 6,893,502 B2 * | 5/2005 | Papadimitrakopoulos et al. | ............................ | 117/92 |
| 6,946,086 B2 * | 9/2005 | Foulger et al. | ............. | 252/586 |
| 7,008,567 B2 * | 3/2006 | Foulger et al. | ............. | 252/583 |
| 7,045,195 B2 * | 5/2006 | Ozin et al. | ................... | 428/173 |
| 7,064,886 B2 * | 6/2006 | Moon et al. | ................. | 359/321 |
| 7,153,360 B2 * | 12/2006 | Herman et al. | ............... | 117/68 |

OTHER PUBLICATIONS

A. L. Rogach et al.:, "Electrophoretic Deposition of Latex-Based 3D Colloidal Photonic Crystals: a technique for Rapid Production of High-Quality Opals", Chemistry of Materials, vol. 12, No. 9, 2000, pp. 2721-2726.

Kumacheva E et al:, "Colloid Crystal Growth on Mesoscopically Patterned Surfaces: Effect of Confinement", Advanced Materials, VCH Verlagsgesellschaft, Weinheim, DE, vol. 14, No. 3, Feb. 5, 2002, pp. 221-224, XP001129538.

* cited by examiner

METHOD FOR PATTERNING
SELF-ASSEMBLED COLLOIDAL PHOTONIC
CRYSTALS AND METHOD FOR
FABRICATING 3-DIMENSIONAL PHOTONIC
CRYSTAL WAVEGUIDES OF AN
INVERTED-OPAL STRUCTURE USING THE
PATTERNING METHOD

CROSS-REFERENCE TO RELATED
APPLICATIONS

This application claims benefit under 35 U.S.C. § 119 from Korean Patent Application No. 2004-10977, filed on Feb. 19, 2004, the entire content of which is incorporated herein by reference.

BACKGROUND OF THE INVENTION

1. Field of the Invention

The present invention relates to a method for forming self-assembled colloidal photonic crystals on a selected area of a substrate or forming self-assembled colloidal photonic crystals having different diameters on the same substrate using an electric field, and a method for fabricating three-dimensional photonic crystal waveguides of an inverted-opal structure using the self-assembled colloidal photonic crystals patterned by the patterning method.

2. Description of the Related Art

Photonic band gap structures in photonic crystals composed of dielectrics having a three-dimensional periodicity have become a matter of increasing interest. The photonic band gap structures are highly applicable to diverse optoelectronic devices such as microlasers, filters, high-efficiency LEDs, optical switches, low-loss waveguides, etc. In an initial stage of investigation, a three-dimensional photonic band gap in a microwave range was realized by providing periodicity to the dielectric constant of a dielectric-air structure by making small holes in a parallel direction on a silicon wafer or by stacking bar-shaped dielectrics in piles. However, in the wavelength ranges of infrared rays and visible light, it was only possible to form a two-dimensional photonic band gap. This is because it was very difficult to form a three-dimensional photonic band gap due to the need for scaling-down the etching space. In the case of a three-dimensional photonic band gap, the holographic lithography of laser light was used. Recently, research for methods of self-assembling small spheres (colloids) having a diameter of several hundred nanometers (nm) has been conducted.

In particular, diverse methods for fabricating self-assembled colloidal photonic crystals have been studied. One of the methods most frequently used is a dip-coating method for fabricating photonic crystals which utilizes capillary force exerted among a colloidal fluid, a substrate and colloidal particles. This dip-coating method is easy to carry out, and can form photonic crystals having a high crystallization in a wide area. However, it is difficult to selectively control the colloidal particles, and many semiconductor processes such as the lithography are required for patterning the photonic crystals. Additionally, in the case of forming photonic crystal of different kinds of colloidal particles or colloidal particles having different sizes, a template is required. Also, in the case of forming colloidal photonic crystals using three or more kinds of colloidal particles or colloidal particles having three or more sizes, the fabricating processes become complicated with limitations in design.

The most frequently used method for fabricating waveguides using photonic crystals comprises forming a transmission line from two-dimensional photonic crystals formed by periodically etching fine holes onto a silicon substrate. The two-dimensional photonic crystal has a photonic band gap and therefore results in no photonic loss in a two-dimensional light-traveling direction, but does suffer photonic loss in other light-traveling directions.

Meanwhile, because the three-dimensional photonic crystal of an inverted-opal structure has a photonic band gap in all three-dimensional light-traveling directions, a waveguide using these three-dimensional photonic crystals can greatly reduce photonic loss in comparison to a two-dimensional photonic crystal. The fabrication of a waveguide having the three-dimensional photonic band gap requires a high-grade etching technique such as e-beam lithography, a high fabricating cost and considerable manufacturing time, and it is difficult to implement the waveguide in a wide area. Accordingly, there has been an increasing demand for and interest in a method for fabricating three-dimensional photonic crystal waveguides of an inverted-opal structure through self-assembly of colloidal particles that can easily allow for fabricating photonic crystals in a wide area.

Conventional methods for fabricating three-dimensional photonic crystal waveguides of an inverted-opal structure have been proposed as follows.

First, the method described in "Multi-Photon Polymerization of Waveguide Structures within Three-Dimensional Photonic Crystals", Advanced Materials, vol. 14, 2003, pp 271–294 by W. Lee et al. has problems due to material and area limitations. Second, the method described in "Micromolding of Three-Dimensional Photonic Crystals on Silicon Substrates", Nanotechnology, vol. 14, 2003, pp 323–326 by P. Ferrand et al. also has problems in that its process is complicated and the photonic crystals are broken with the occurrence of cracks during an artificial piling up of the photonic crystals.

SUMMARY OF THE INVENTION

The present invention has been achieved in order to solve the above drawbacks and other problems associated with the above conventional arrangements. It is therefore an object of the present invention to provide a method for forming self-assembled colloidal photonic crystals through control of fine colloidal particles using patterned electrodes without the use of a template, and a method for fabricating three-dimensional photonic crystal waveguides of an inverted-opal structure having a photonic band gap in all light traveling directions using the patterning method.

The foregoing and other objects and advantages of the present invention have been realized by providing a method for forming self-assembled colloidal photonic crystals, which comprises the steps of depositing first and second conductive films separate from each other, on an area corresponding to a pattern of the self-assembled colloidal photonic crystals that are to be formed on a substrate and on another area except for the area corresponding to the pattern, respectively, and applying a specified DC voltage to the first and second conductive films while growing photonic crystals on the substrate on which the first and second conductive films are deposited using a dip-coating method.

A voltage for exerting an attractive force against charges of colloidal particles is preferably applied to the first conductive film on which the self-assembled colloidal structure is formed, and a voltage for exerting a repulsive force against the charges of the colloidal particles is applied to the second conductive film.

In another aspect, the present invention provides a method for fabricating three-dimensional photonic crystal waveguides of an inverted-opal structure which comprises the steps of (a) forming a first conductive film corresponding to a pattern of an optical transmission line to be formed on a substrate and a second conductive film arranged at both ends of the first conductive film separate from the first conductive film, (b) forming on the substrate a first photonic crystal of an opal structure having a cavity formed on an upper part of the first conductive film and composed of first colloidal particles and first nanoparticles through a dip-coating method by controlling polarities of a voltage applied to the first and second conductive films, (c) forming in the cavity area a second photonic crystal of an opal structure composed of second colloidal particles and second nanoparticles different from the first colloidal particles and the first nanoparticles, (d) forming a photonic crystal composed of the first colloidal particles and the first nanoparticles on the first and second photonic crystals, (e) forming an optical transmission line constituting a void space by removing the second photonic crystal composed of the second colloidal particles and the second nanoparticles, and (f) forming a photonic crystal of an inverted-opal structure by removing the first colloidal particles constituting the first photonic crystal.

Preferably, the step (b) may comprise the steps of (b-1) forming the first photonic crystal on the second conductive film with a specified thickness by applying a voltage for exerting a repulsive force against the first colloidal particles and the first nanoparticles to the first conductive film and applying a voltage for exerting an attractive force against the first colloidal particles and the first nanoparticles to the second conductive film; and (b-2) forming the first photonic crystal between the photonic crystals formed on the second conductive film in step (b-1) with a thickness smaller than that of the photonic crystals formed in step (b-1) by a thickness of the optical transmission line.

Preferably, the step (b) may comprise the steps of (b-1') forming the first photonic crystal on the whole substrate with a specified thickness; and (b-2') forming the first photonic crystal on the second conductive film with a thickness corresponding to a thickness of the optical transmission line by applying a voltage for exerting a repulsive force against the first colloidal particles and the first nanoparticles to the first conductive film and applying a voltage for exerting an attractive force against the first colloidal particles and the first nanoparticles to the second conductive film.

Preferably, corresponding particles are removed in steps (e) and (f) using one or both of a thermal removing method and a chemical removing method.

In still another aspect, the present invention provides a method for fabricating three-dimensional photonic crystal waveguides of an inverted-opal structure, which comprises the steps of (g) forming a first conductive film corresponding to a pattern of an optical transmission line to be formed on a substrate and a second conductive film arranged at both ends of the first conductive film separate from the first conductive film, (h) forming on the substrate a first photonic crystal of an opal structure composed of first colloidal particles so as to form a cavity on an upper part of the first conductive film, (i) forming in the cavity a second photonic crystal of an opal structure composed of second colloidal particles, (j) forming a photonic crystal composed of the first colloidal particles on the first and second photonic crystals, (k) forming an optical transmission line constituting a void by removing the second photonic crystal, (l) filling voids in the first photonic crystal and the void space of the optical transmission line with a specified material, and (m) forming a photonic crystal of an inverted-opal structure by removing the first colloidal particles.

Preferably, the step (h) may comprise the steps of (h-1) forming the first photonic crystal on the second conductive film with a specified thickness by applying a voltage for exerting a repulsive force against the first colloidal particles to the first conductive film and applying a voltage for exerting an attractive force against the first colloidal particles to the second conductive film; and (h-2) forming the first photonic crystal between the photonic crystals formed on the second conductive film in step (h-1) with a thickness smaller than that of the photonic crystal formed in step (h-1) by a thickness of the optical transmission line.

Preferably, the step (h) may comprise the steps of (h-1') forming the first photonic crystal on the whole substrate with a specified thickness; and (h-2') forming the first photonic crystal on the second conductive film with a thickness corresponding to a thickness of the optical transmission line by applying a voltage for exerting a repulsive force against the first colloidal particles to the first conductive film and applying a voltage for exerting an attractive force against the first colloidal particles to the second conductive film.

Preferably, corresponding particles are removed in steps (k) and (m) using one or both of a thermal removing method and a chemical removing method.

Preferably, at the step (l), a polymer may be used as the specified material.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE PREFERRED EMBODIMENTS

Certain embodiments of the present invention will next be described in greater detail with reference to the accompanying drawings. However, the present invention should not be construed as being limited thereto.

In the following description, the same drawing reference numerals are used for the same elements even in different drawings. The detailed description below is provided to assist in a comprehensive understanding of the present invention. Thus, it is apparent that the present invention can be carried out without being limited to such structure. Also, well-known functions or constructions are not described in detail since they would obscure the present invention in unnecessary detail.

Figure 1:
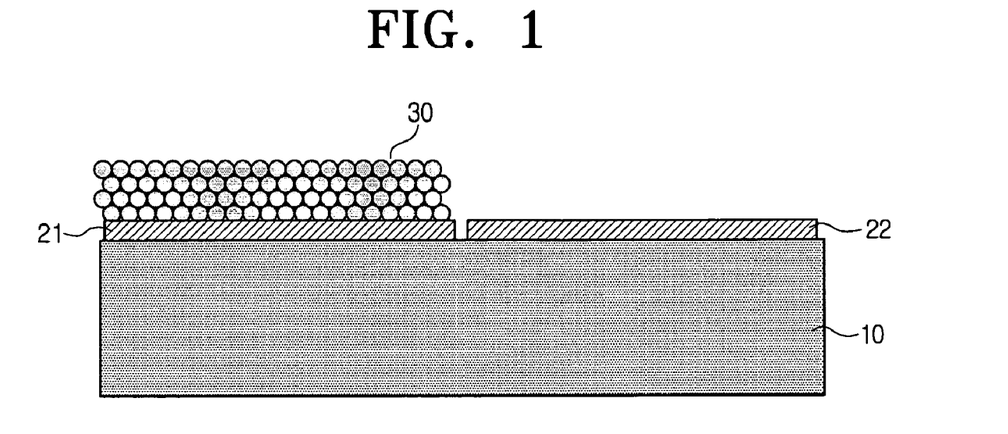
FIG. 1 is a sectional view of a self-assembled colloidal photonic crystal selectively formed on a specified area patterned on a substrate according to a first embodiment of the present invention.

FIG. 1 is a sectional view of a self-assembled colloidal photonic crystal selectively formed on a specified area patterned on a substrate according to a first embodiment of the present invention.

Referring to FIG. 1, a first conductive film 21 separate from a second conductive film 22 of a specified pattern are formed on a substrate 10, and a self-assembled colloidal photonic crystal 30 is formed only on the first conductive film 21.

According to the method for patterning the self-assembled colloidal structure, a position, in which the self-assembled colloidal photonic crystal is formed, is selectively determined by controlling the attractive force or repulsive force exerted between colloidal particles having a polarity and electrodes, i.e., the conductive films, by applying a voltage to the conductive films formed in the specified pattern. Using this method, as illustrated in FIG. 1, the self-assembled colloidal photonic crystal 30 can be formed only on the specified part, i.e., the first conductive film 21, of the substrate 10.

Figure 2:
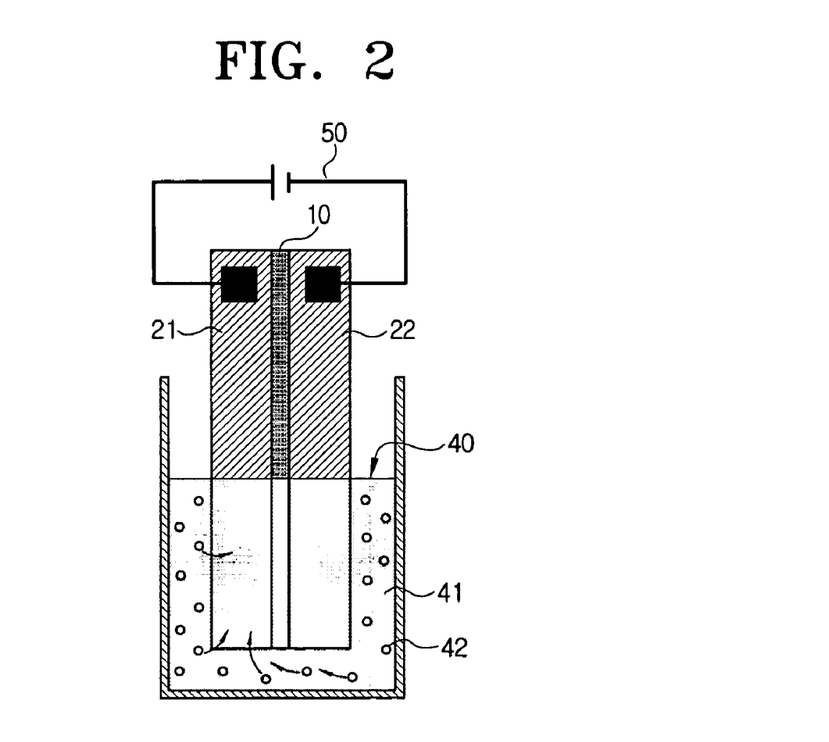
FIG. 2 is a view explaining a method of forming the self-assembled colloidal photonic crystal illustrated in FIG. 1.

FIG. 2 is a view explaining a method of forming the self-assembled colloidal photonic crystal 30 of the specified pattern by an electric field formed by the electrodes 21 and 22 patterned on the substrate 10 and a dip-coating method.

Basically, in order to grow the self-assembled colloidal photonic crystal 30, a dip-coating method that uses a capillary force exerted among a colloidal fluid 40, the substrate 10 and the colloidal particles is employed. The first and second conductive films 21 and 22 having a pattern as illustrated in FIG. 2 are deposited on the substrate 10 with a specified thickness. The substrate 10 on which the first and second conductive films 21 and 22 are formed is vertically dipped into the colloidal fluid 40 in which the colloidal particles 42 are dispersed, and then slowly raised in a vertical direction. This action results in forming the self-assembled colloidal photonic crystal on the substrate 10 on which the first and second conductive films 21 and 22 are formed by capillary force exerted among the colloidal fluid 40, the substrate 10 and the colloidal particles.

In this case, by applying a DC voltage 50 across the first and second conductive films, i.e., metal plates 21 and 22, the first metal plate 21, which corresponds to the area in which the self-assembled colloidal photonic crystal is formed, forms a positive electrode and the second metal plate 22 forms a negative electrode. By drawing the substrate slowly in the vertical direction, the positive electrode 21 attracts colloidal particles 42 having negative charges, and thus the self-assembled colloidal photonic crystal 30 is formed on the positive electrode 21. By contrast, the negative electrode 22 repulses the colloidal particles 42 having negative charges, and thus no self-assembled colloidal photonic crystal is formed on the negative electrode 22.

The colloidal fluid 40 may be a solution obtained by dispersing colloidal particles 42 such as silica or polystyrene having diameters of several hundred nanometers (nm) in a solvent 41 such as water or alcohol. In the embodiment of the present invention, the self-assembled colloidal crystal 30 is formed only on the positive electrode 21 patterned to a width of 300 μm using water 41 containing 0.3 wt % polystyrene colloidal particles 42 having a negative polarity and a diameter of about 300 nm.

Additionally, by repeating the above-described dip-coating while applying a voltage to the electrodes of diverse patterns to match the part in which the self-assembled colloidal photonic crystal is to be formed, various kinds of self-assembled colloidal photonic crystals having various sizes can be formed on the same substrate.

Hereinafter, a method for fabricating a three-dimensional photonic crystal waveguide of an inverted-opal structure according to the second to fourth embodiments of the present invention will be explained.

FIGS. 3A to 3G are views illustrating, in order, the process of fabricating three-dimensional photonic crystal waveguides of an inverted-opal structure according to a second embodiment of the present invention. FIGS. 4A to 4G are views illustrating, in order, the process of fabricating three-dimensional photonic crystal waveguides of an inverted-opal structure according to a third embodiment of the present invention. The fabricating methods according to the second and third embodiments of the present invention provide a three-dimensional photonic crystal waveguide having an optical transmission line constituting a void (empty) space inside the photonic crystals using different kinds of colloidal particles $C_1$ and $C_2$ and different kinds of nanoparticles $N_1$ and $N_2$.

First, the method for fabricating three-dimensional photonic crystal waveguides of an inverted-opal structure according to the second embodiment of the present invention will be explained with reference to FIGS. 3A to 3G.

Figure 3A:
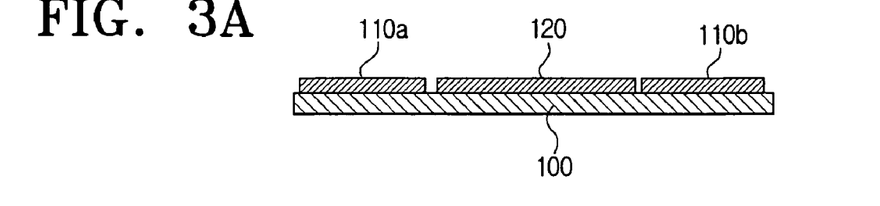
FIGS. 3A to 3G are views illustrating, in order, a process of fabricating three-dimensional photonic crystal waveguides of an inverted-opal structure according to a second embodiment of the present invention.

In FIG. 3A, a first conductive film 120 having a pattern corresponding to a part on which an optical transmission line will be formed, and second conductive films 110a and 110b arranged at both ends of and separate from the first conductive film 120, are deposited on a substrate 100.

When the substrate 100 is vertically dipped into a colloidal fluid A (in which colloidal particles ($C_1$) 132 and nanoparticles ($N_1$) 134, which have the same charges but have different thermal or chemical characteristics, are mixed into a solvent in a proper ratio) and then drawn at a constant speed to perform dip-coating, a voltage for exerting a repulsive force against the charges of the colloidal particles ($C_1$) 132 and the nanoparticles ($N_1$) 134 is applied to the first conductive film 120, and a voltage for exerting an attractive force against the charges of the colloidal particles ($C_1$) 132 and the nanoparticles ($N_1$) 134 is applied to the second conductive film 110a and 110b. Accordingly, photonic crystals of an opal structure are formed by colloidal self-assembly only on the second conductive film 110a and 110b, and the nanoparticles ($N_1$) 134 infiltrate into voids between the colloidal particles ($C_1$) 132 to form the photonic crystals 130a and 130b of an opal structure in which the empty space filled with the nanoparticles ($N_1$) as illustrated in FIG. 3B.

Figure 3B:
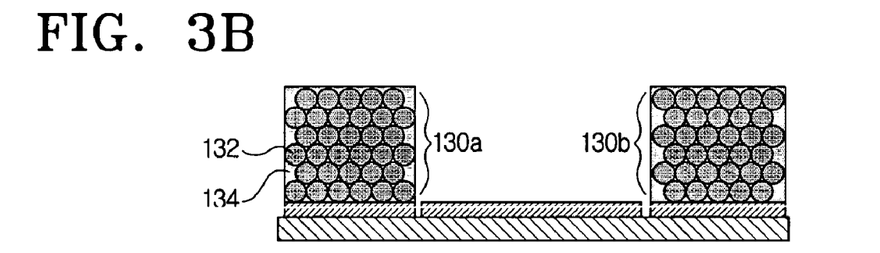
Figure 3C:
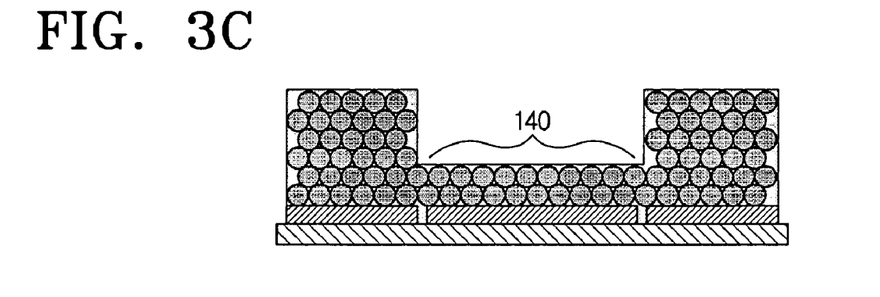

Then, if dip-coating is performed again with respect to the sample of in FIG. 3B using the same colloidal fluid A, the photonic crystals 130a and 130b formed on the second conductive film 110a and 110b serve as a channel, and a photonic crystal 140 is formed only between the photonic crystals 130a and 130b formed on the second conductive film 110a and 110b as illustrated in FIG. 3C. At that time, the thickness of the photonic crystal formed as above is adjusted to be smaller than that illustrated in FIG. 3B by reducing the concentration of the colloidal fluid A as compared to that used in the process of FIG. 3B, or by increasing the drawing speed of the substrate as compared to that used in the process of FIG. 3B. Here, the thickness difference corresponds to the thickness of the optical transmission line that is to be formed.

Then, dip-coating is carried out with respect to the sample of FIG. 3C, using a colloidal fluid B in which the colloidal particles ($C_1$) 132 and the nanoparticles ($N_1$) 134 and colloidal particles ($C_2$) 152 and nanoparticles ($N_2$) 154 having thermal or chemical characteristics different from the colloidal particles ($C_1$) 132 and the nanoparticles ($N_1$) 134 are mixed into a solvent in a proper ratio. As a result, photonic crystals 130a, 130b and 150 are formed of a structure in which two kinds of colloidal particles 132 and 152 and two kinds of nanoparticles 134 and 154 are mixed as shown in FIG. 3D.

Figure 3D:
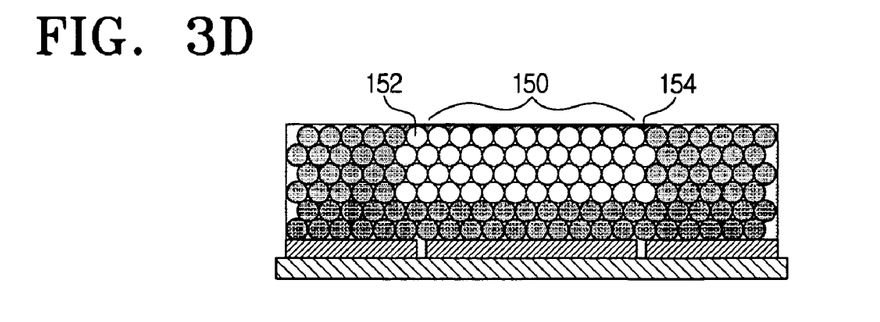
Figure 3E:
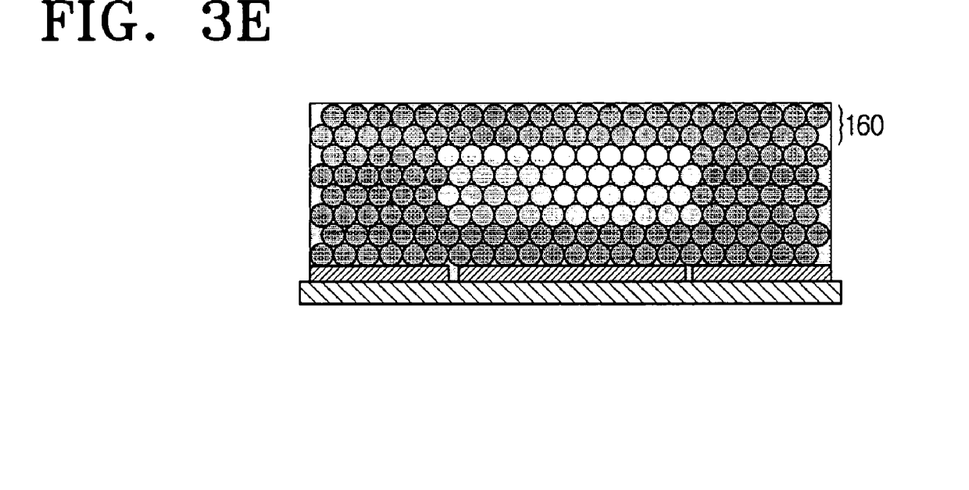

By performing the dip-coating again with respect to the sample of FIG. 3D using the colloidal fluid B as shown in the process of FIG. 3C, a photonic crystal 160 is formed on the whole area of the sample of FIG. 3D with a specified thickness (See FIG. 3E).

Figure 3F:
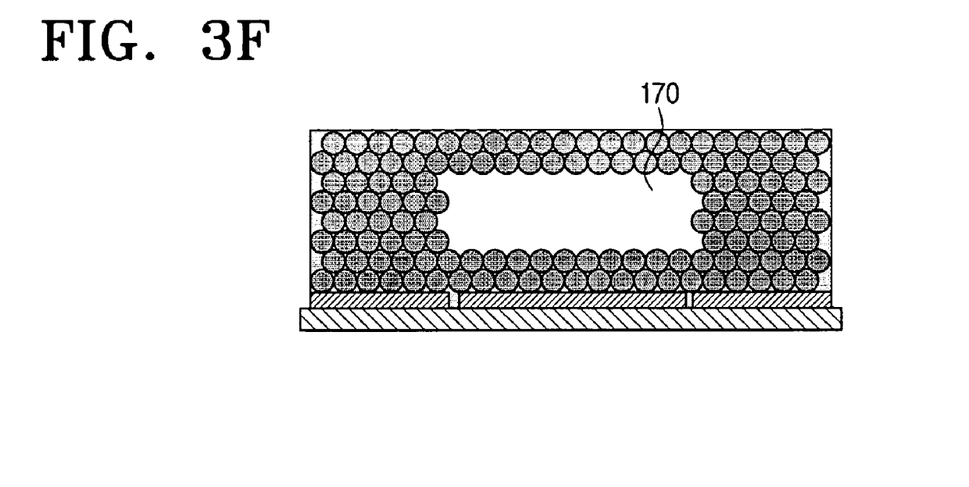

Then, by removing the colloidal particles ($C_2$) 152 and the nanoparticles ($N_2$) 154 using a thermal or chemical method that can remove the colloidal particles ($C_2$) 152 and the nanoparticles ($N_2$) 154 but which does not affect the colloidal particles ($C_1$) 132 and the nanoparticles ($N_1$) 134, an optical transmission line 170 of empty space is formed inside the photonic crystal as illustrated in FIG. 3F.

Figure 3G:
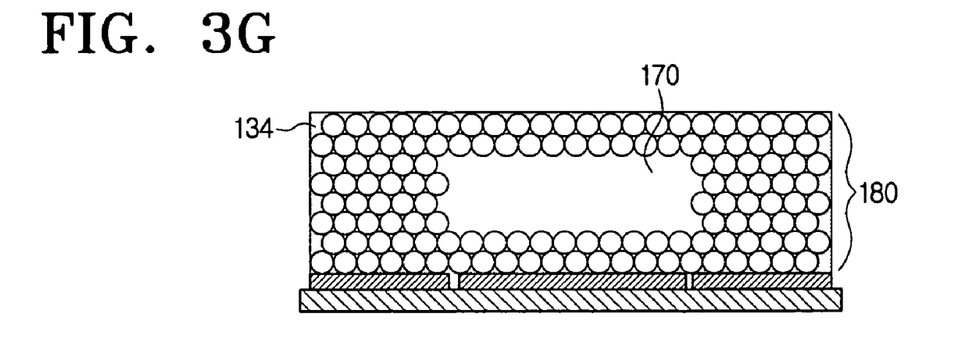

Finally, by removing the colloidal particles ($C_1$) 132 using a thermal or chemical method that can remove the colloidal particles ($C_1$) 132 from the sample of FIG. 3F but which does not affect the nanoparticles ($N_1$) 134, a three-dimensional photonic crystal waveguide 180 of an inverted-opal structure that includes the optical transmission line 170 constituting a void space is formed.

Now, the method for fabricating three-dimensional photonic crystal waveguides of an inverted-opal structure 280 according to the third embodiment of the present invention will be explained with reference to FIGS. 4A to 4G.

Figure 4A:
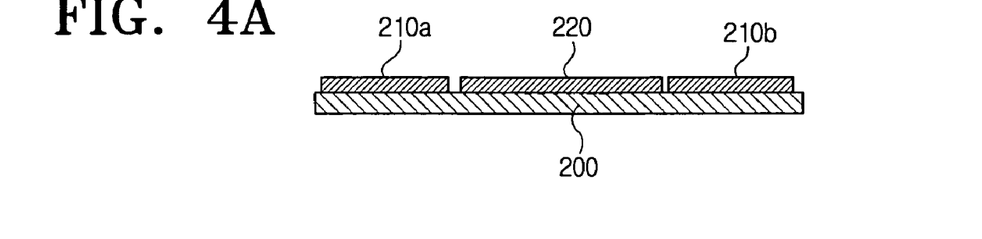
FIGS. 4A to 4G are views illustrating, in order, a process of fabricating three-dimensional photonic crystal waveguides of an inverted-opal structure according to a third embodiment of the present invention.

A first conductive film 220 of a pattern corresponding to a part in which an optical transmission line will be formed and second conductive films 210a and 210b of a pattern corresponding to a part in which only photonic crystals will be present are deposited separate from each other on a substrate 200 (See FIG. 4A).

The substrate 200 is vertically dipped into a colloidal fluid A in which colloidal particles ($C_1$) 232 and nanoparticles ($N_1$) 234, which have the same charges but have different thermal or chemical characteristics, are mixed into a solvent in a proper ratio. The substrate 200 is then drawn at a constant speed to perform dip-coating, and a photonic crystal 230 is grown on the whole of substrate 200 with a specified thickness (See FIG. 4B).

Figure 4B:
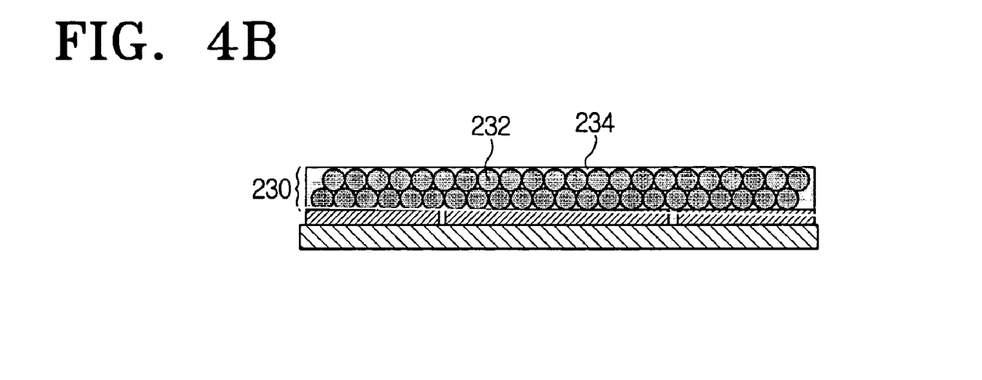
Figure 4C:
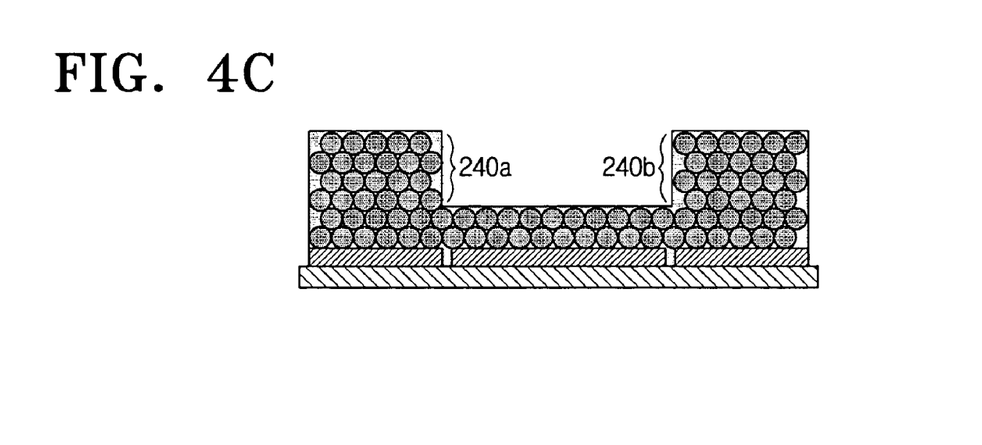
Figure 4D:
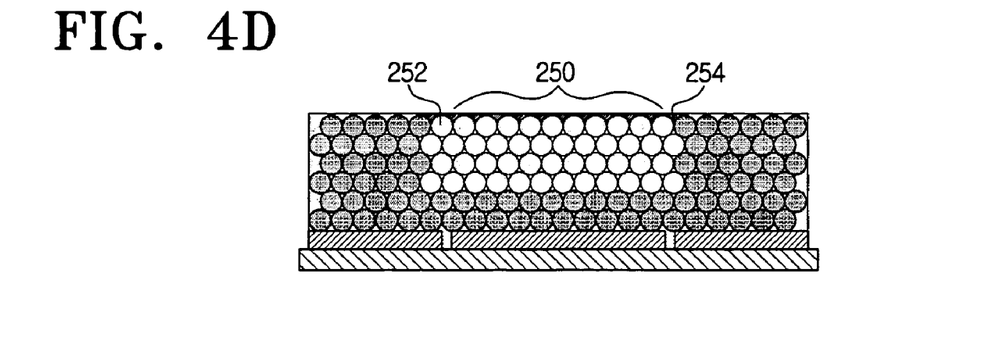
Figure 4E:
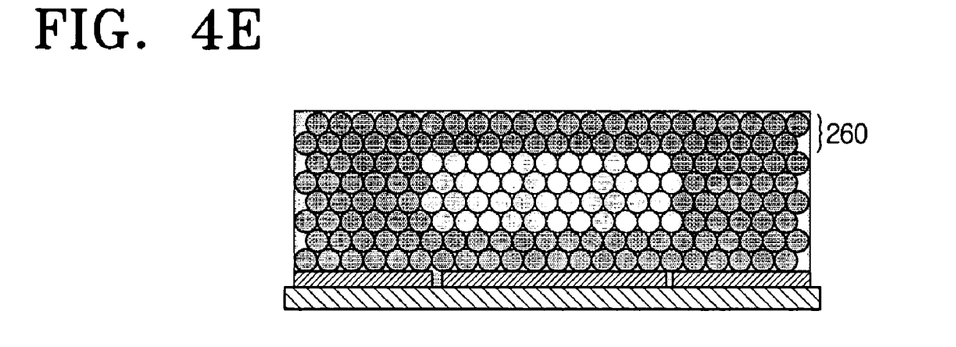
Figure 4F:
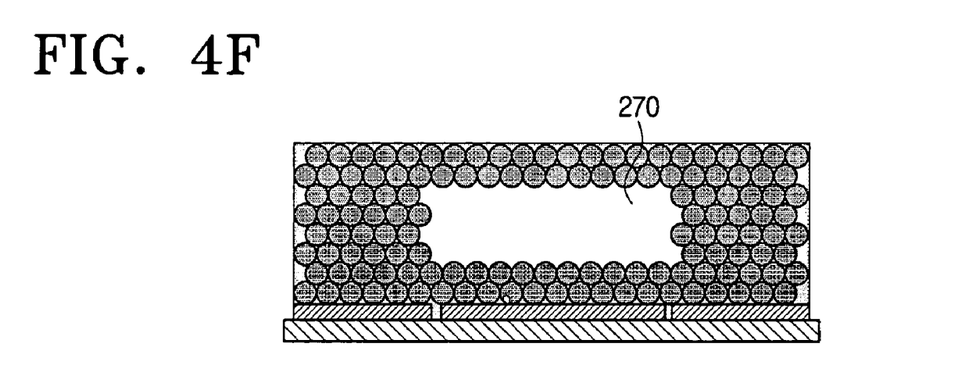
Figure 4G:
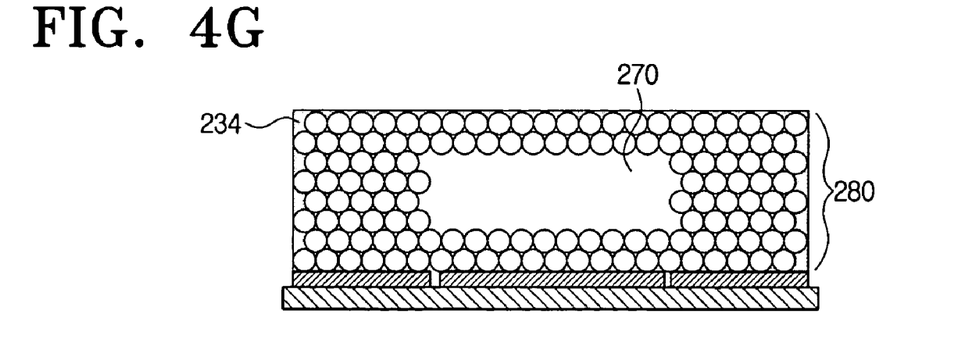

Then, dip-coating is again performed with respect to the sample of FIG. 4B using a colloidal fluid in which the colloidal particles ($C_1$) 232 and the nanoparticles ($N_1$) 234 are mixed into a solvent in a proper ratio. At that time, a voltage for exerting a repulsive force against the charges of the colloidal particles ($C_1$) 232 and the nanoparticles ($N_1$) 234 is applied to the first conductive film 220, and a voltage for exerting an attractive force against the charges of the colloidal particles ($C_1$) 232 and the nanoparticles ($N_1$) 234 is applied to the second conductive film 210a and 210b. Photonic crystals of an opal structure are then formed by colloidal self-assembly only on the second conductive films 210a and 210b, and the nanoparticles ($N_1$) 234 infiltrate into voids between the colloidal particles ($C_1$) 232 to form photonic crystals 240a and 240b having an opal structure in which the empty space is filled with the nanoparticles ($N_1$) as illustrated in FIG. 4C.

The process illustrated in FIGS. 4D to 4G is the same as the process illustrated in FIGS. 3D to 3G, and thus the detailed explanation thereof will be omitted, where reference numerals 250, 252, 254, 260, 270 and 280 correspond to 150, 152, 154, 160, 170 and 180, respectively.

FIGS. 5A to 5H are views illustrating, in order, a process of fabricating three-dimensional photonic crystal waveguides of an inverted-opal structure according to a fourth embodiment of the present invention, and FIGS. 6A to 6H are views illustrating, in order, a process of fabricating three-dimensional photonic crystal waveguides of an inverted-opal structure according to a fifth embodiment of the present invention.

Fabricating methods according to the fourth and fifth embodiments of the present invention provide a three-dimensional photonic crystal waveguide having an optical transmission line filled with different kinds of colloidal particles $C_1$ and $C_2$ and an infiltrating material.

Now, the method for fabricating three-dimensional photonic crystal waveguides of an inverted-opal structure according to the fourth embodiment of the present invention will be explained with reference to FIGS. 5A to 5H.

Figure 5A:
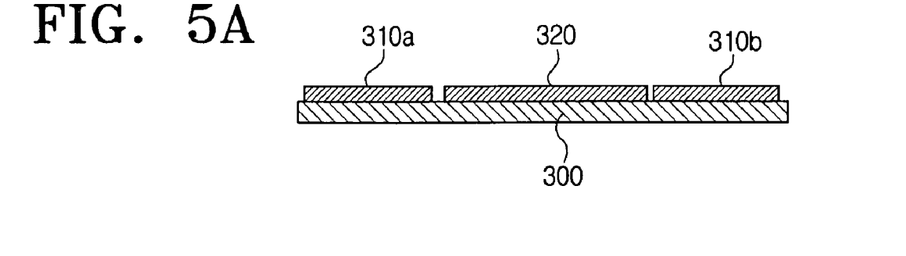
FIGS. 5A to 5H are views illustrating, in order, a process of fabricating three-dimensional photonic crystal waveguides of an inverted-opal structure according to a fourth embodiment of the present invention.

In FIG. 5A, a first conductive film 320 having a pattern corresponding to a part in which an optical transmission line will be formed and second conductive films 310a and 310b having a pattern corresponding to a part in which only photonic crystals will be formed are deposited separate from each other on a substrate 300.

Figure 5B:
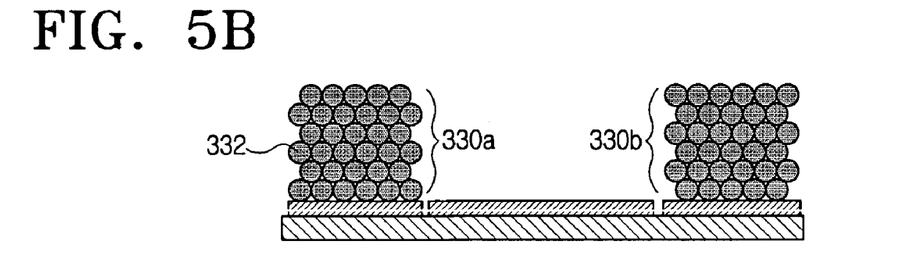

When the substrate 300 is vertically dipped into a colloidal fluid C (in which colloidal particles ($C_1$) 332, of specified charge and thermal or chemical characteristics, are mixed into a solvent in a proper ratio) and then drawn at a constant speed to perform dip-coating, a voltage for exerting a repulsive force against the charges of the colloidal particles ($C_1$) 332 is applied to the first conductive film 320, and a voltage for exerting an attractive force to the charges of the colloidal particles ($C_1$) 332 is applied to the second conductive film 310a and 310b. Accordingly, photonic crystals 330a and 330b having an opal structure are formed by colloidal self-assembly only on the second conductive film 310a and 310b.

Figure 5C:
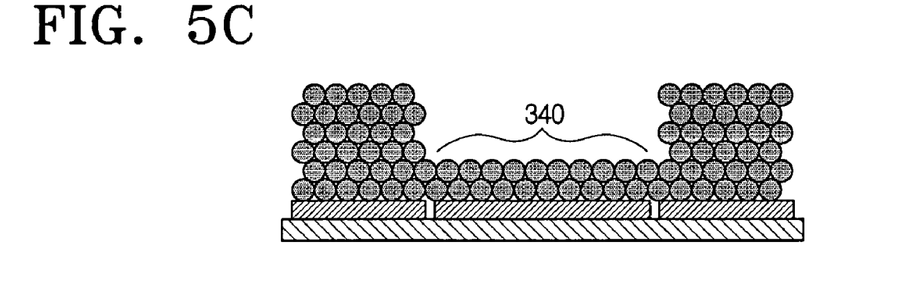

Then, if the dip-coating is performed again with respect to the sample of FIG. 5B using the colloidal fluid C, the photonic crystals 330a and 330b already formed on the second conductive films 310a and 310b serve as a channel, and a photonic crystal 340 is formed only between the photonic crystals 330a and 330b disposed on the second conductive films 310a and 310b as illustrated in FIG. 5C. At that time, the thickness of the photonic crystal formed as above is adjusted to be smaller than that illustrated in FIG. 5B by using a lower concentration of the colloidal fluid C than that used in the process of FIG. 5B, or by increasing the drawing speed of the substrate relative to that of the process of FIG. 5B.

Figure 5D:
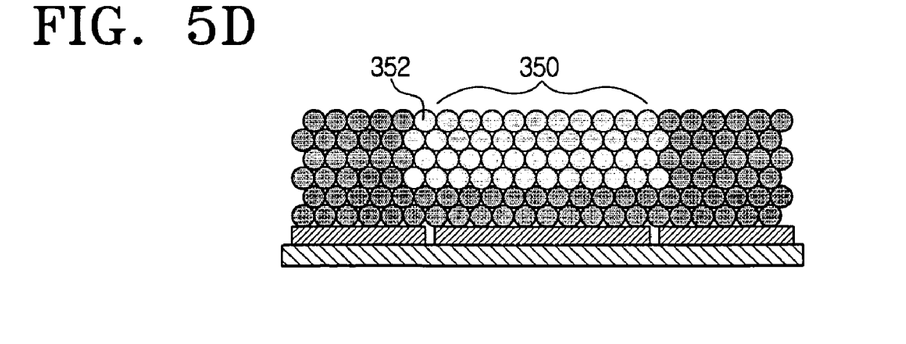

Then, by dip-coating the sample of FIG. 5C using a colloidal fluid D (in which the colloidal particles ($C_1$) 332 and colloidal particles ($C_2$) 352 having thermal or chemical characteristics different from those of the colloidal particles ($C_1$) 332 are mixed into a solvent in a proper ratio), photonic crystals 330a, 330b and 350 of a structure in which two kinds of colloidal particles 332 and 352 are mixed are formed as shown in FIG. 5D.

Figure 5E:
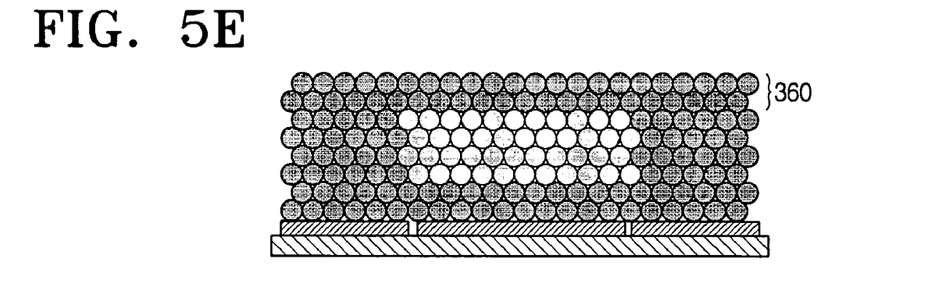

By dip-coating again with respect to the sample of FIG. 5D using the colloidal fluid C in which colloidal particles ($C_1$) 332 are mixed into the solvent in a proper ratio as in the process of FIG. 5C, a photonic crystal 360 is formed on the whole area of the sample of FIG. 5D with a specified thickness (See FIG. 5E).

Figure 5F:
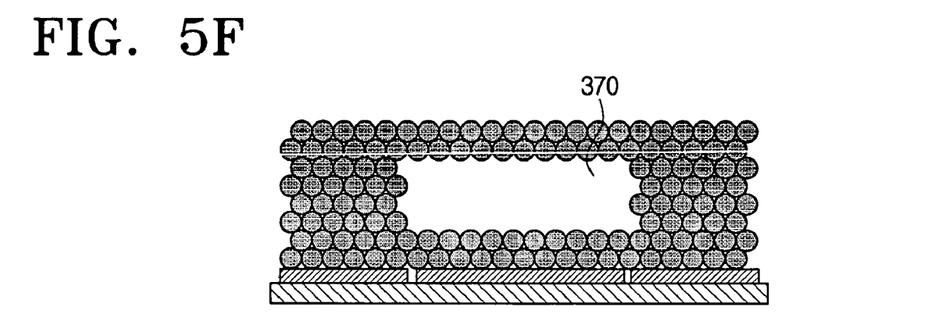

Then, by removing the colloidal particles ($C_2$) 352 using a thermal or chemical method that can remove the colloidal particles ($C_2$) 352 but which does not affect the colloidal particles ($C_1$) 332, an optical transmission line 370 constituting a void space is formed in the photonic crystal (See FIG. 5F).

Figure 5G:
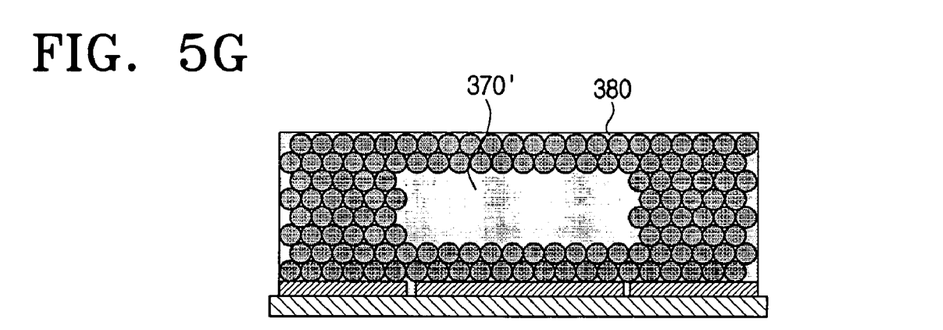

Then, a material 380 such as polymer is infiltrated into the optical transmission line 370 constituting a void space and between the colloidal particles 332 and 352 of the photonic crystals already formed (See FIG. 5G).

Figure 5H:
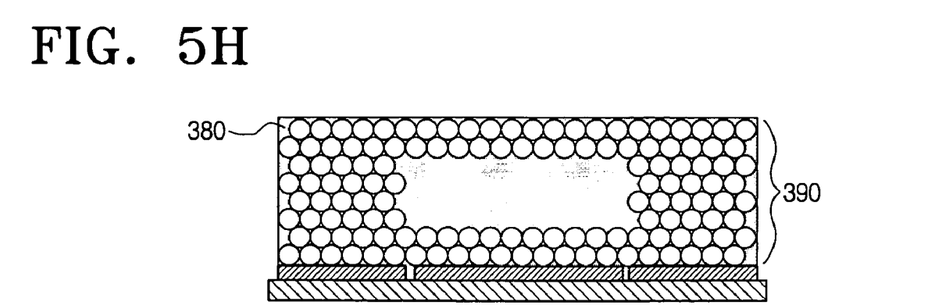

Finally, by removing the colloidal particles ($C_1$) 332 using a thermal or chemical method that can remove the colloidal particles ($C_1$) 332 from the sample of FIG. 5G but which does not affect the nanoparticles (N) 334, a three-dimensional photonic crystal waveguide 390 of an inverted-opal structure is obtained as shown in FIG. 5H that includes the optical transmission line 370' composed of the nanoparticles (N) 334.

Now, a method for fabricating three-dimensional photonic crystal waveguides 490 having an inverted-opal structure according to a fifth embodiment of the present invention will be explained with reference to FIGS. 6A to 6G.

Figure 6A:
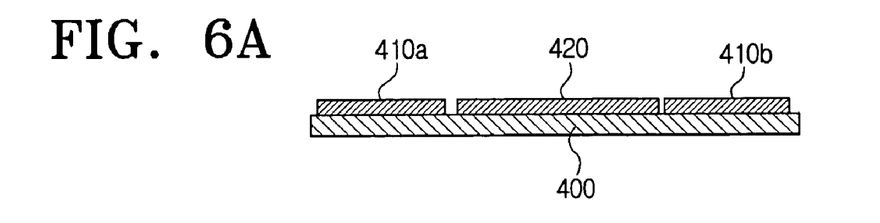
FIGS. 6A to 6H are views illustrating, in order, a process of fabricating three-dimensional photonic crystal waveguides of an inverted-opal structure according to a fifth embodiment of the present invention.

A first conductive film 420 of a pattern corresponding to a part in which an optical transmission line will be formed and second conductive films 410a and 410b of a pattern corresponding to a part in which only photonic crystals will be formed are deposited separate from each other on a substrate 400 (See FIG. 6A).

The substrate 400 is vertically dipped into a colloidal fluid (in which colloidal particles ($C_1$) 432, of specified charge and thermal or chemical characteristics, are mixed into a solvent in a proper ratio), and then is drawn at a constant speed to perform a dip-coating. As a result, a photonic crystal 430 is grown on the whole of substrate 400 with a specified thickness (See FIG. 6B).

Figure 6B:
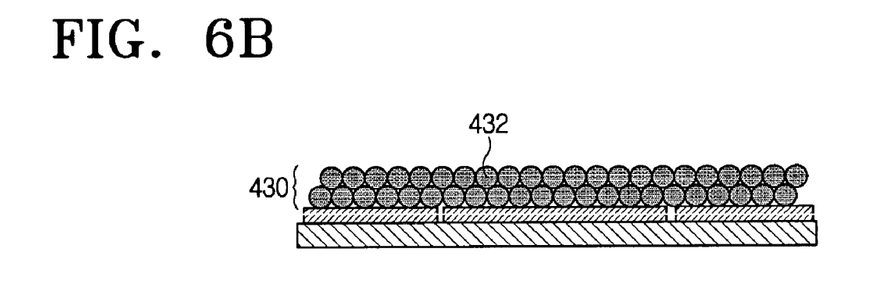
Figure 6C:
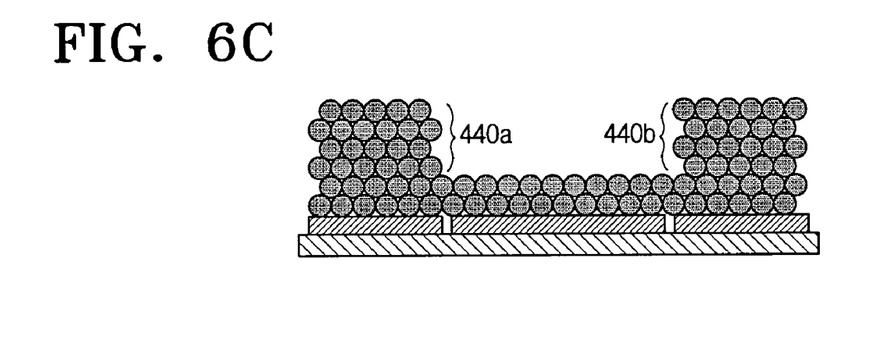
Figure 6D:
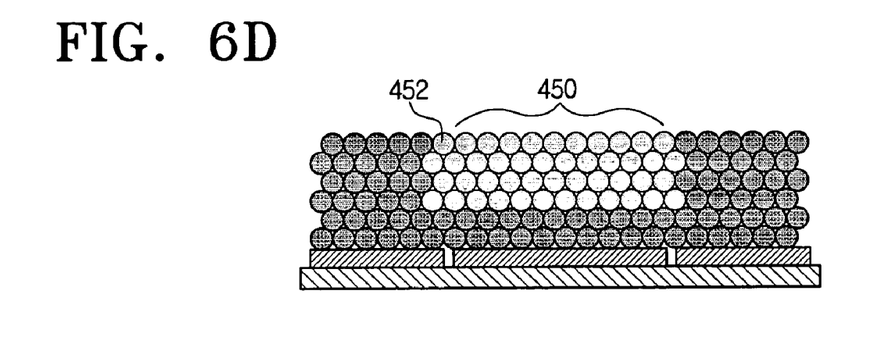
Figure 6E:
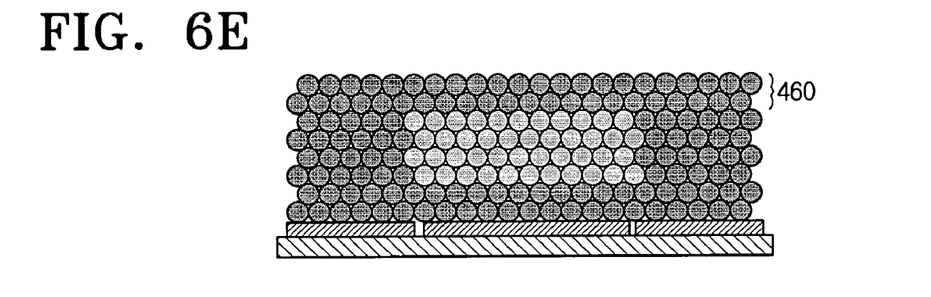
Figure 6F:
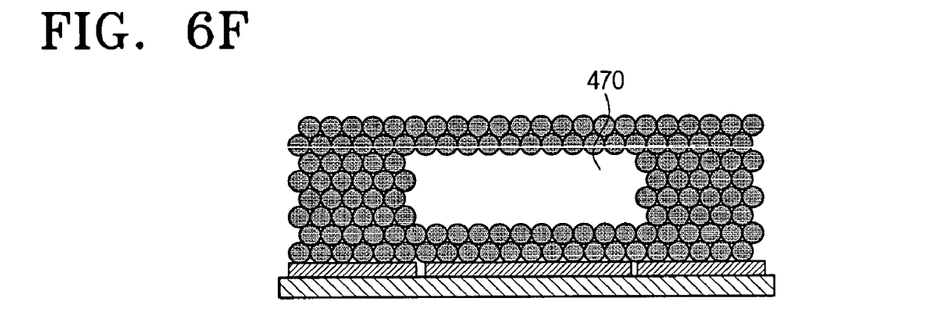
Figure 6G:
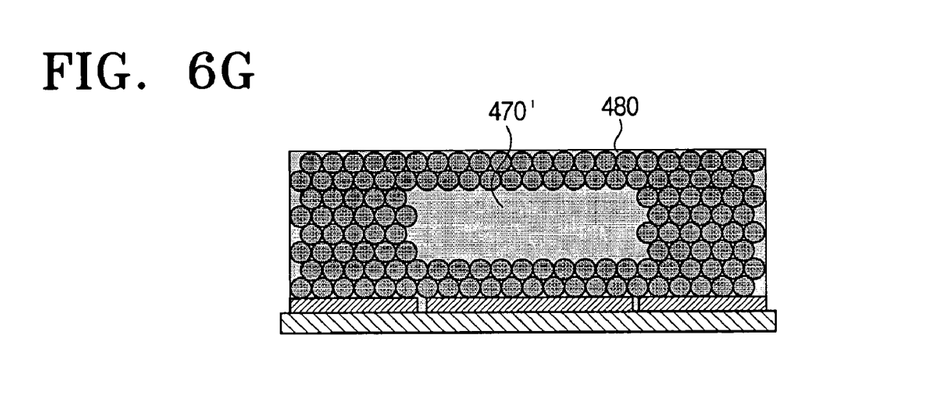
Figure 6H:
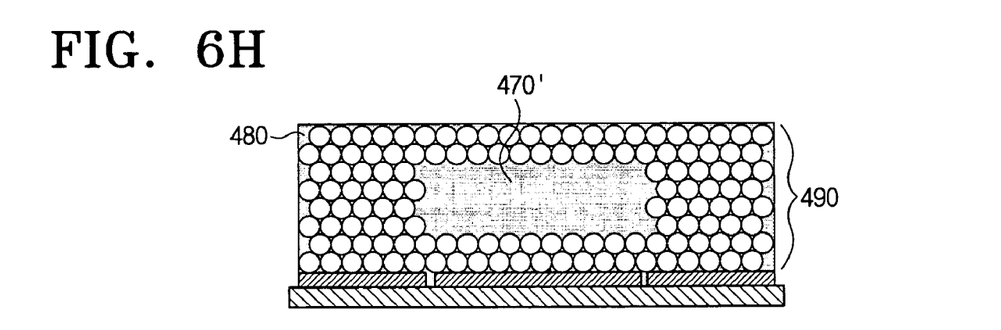

Then, dip-coating is carried out again with respect to the sample of in FIG. 6B using a colloidal fluid in which the colloidal particles ($C_1$) 432 are mixed into a solvent in a proper ratio. At that time, if a voltage for exerting a repulsive force against the charges of the colloidal particles ($C_1$) 432 is applied to the first conductive film 420, and a voltage for exerting an attractive force against the charges of the colloidal particles ($C_1$) 432 is applied to the second conductive film 410a and 410b, photonic crystals having an opal structure are formed by colloidal self-assembly only on the second conductive film 410a and 410b (See FIG. 6C).

The process illustrated in FIGS. 6D to 6H is the same as the process illustrated in FIGS. 5D to 5H, and thus a detailed explanation thereof will be omitted, where reference numerals 440a, 440b, 450, 452, 460, 470, 470' and 480 correspond to 340a, 340b, 350, 352, 360, 370, 370' and 380, respectively.

As described above, according to the present invention, the self-assembled colloidal photonic crystals can be formed in a pattern by controlling the colloidal particles using patterned electrodes without the need for a template, and thus the fabricating time and cost can be greatly reduced. Additionally, by defining the electrodes patterned on the substrate, various types of colloidal photonic crystals can be fabricated, and various kinds of colloidal photonic crystals having diverse sizes can be formed on the same substrate.

Meanwhile, because the three-dimensional photonic crystal waveguides having an inverted-opal structure fabricated according to the present invention can provide optical transmission with greatly reduced loss irrespective of the angle of bent portions of the waveguide, a photonic network capable of performing diverse functions such as photonic branching, coupling, reflection, phase modulation, raising, amplifying, etc., can be constructed. Thus, an essential technology required for the development of photonic interconnections, photonic ICs, etc., can be implemented.

The foregoing embodiment and advantages are merely exemplary and are not to be construed as limiting the present invention. The present teachings can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A method for forming self-assembled colloidal photonic crystals, which comprises:
    depositing first and second conductive films on a substrate separate from each other, on an area of the substrate corresponding to a pattern of the self-assembled colloidal photonic crystals that are to be formed and on another area of the substrate except for the area corresponding to the pattern, respectively; and
    growing the photonic crystals on the substrate on which the first and second conductive films are deposited by dip-coating in a fluid containing colloidal particles while applying a DC voltage to the respective first and second conductive films.

2. The method as claimed in claim 1, wherein said colloidal particles are charged colloidal particles, and which method comprises applying a voltage for exerting an attractive force against the charges of the colloidal particles to the first conductive film on which the self-assembled colloidal photonic crystals are formed, and applying a voltage for exerting a repulsive force against the charges of the colloidal particles to the second conductive film.

* * * * *